(12) United States Patent
Kazama et al.

(10) Patent No.: US 6,599,811 B1
(45) Date of Patent: *Jul. 29, 2003

(54) SEMICONDUCTOR DEVICE HAVING A SHALLOW ISOLATION TRENCH

(75) Inventors: Kenya Kazama, Tokyo (JP); Osamu Sugawara, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 291 days.

(21) Appl. No.: 09/249,556

(22) Filed: Feb. 12, 1999

(30) Foreign Application Priority Data

Feb. 12, 1998 (JP) ............................................ 10-029998

(51) Int. Cl.[7] .............................................. H01L 21/76

(52) U.S. Cl. ........................ 438/424; 438/296; 438/359; 438/435

(58) Field of Search ................................ 438/424, 435, 438/427, 437, 424.427, 435.437, 218–221

(56) References Cited

U.S. PATENT DOCUMENTS 5,726,090 A * 3/1998 Jang et al. .................... 438/435
6,001,706 A * 12/1999 Tan et al. ..................... 438/424

FOREIGN PATENT DOCUMENTS

| EP | 0 813 240 | 12/1997 |
| JP | 64-25433 | 1/1989 |
| JP | 2-294050 | 12/1990 |
| JP | 3-48440 | 3/1991 |
| JP | 4-106923 | 4/1992 |
| JP | 11-220017 | 8/1999 |

OTHER PUBLICATIONS

S. Nag et al., "Comparative Evaluation of Gap–Fill Dielectrics in Shallow Trench Isolation for Sub–0.25 μm Technologies", *International Electron Devices Meeting*, IEEE, Dec. 8, 1996, pp. 841–844.

A. Chatterjee et al., "A Shallow Trench Isolation Using LOCOS Edge for Preventing Corner Effects for 0.25/0.18μm CMOS Technologies and Beyond", *International Electron Devices Meeting*, IEEE, Dec. 8, 1996, pp. 829–832.

K. Shiozawa et al., "Electrical Characteristics of Ultra–Fine Trench Isolation Fabricated by a New Two–Step Filling Process", *Japanese Journal of Applied Physics*, vol. 35, Part 2, No. 12B, Dec. 15, 1996, pp. L1625–L1627.

K. Shiozawa et al., "Electrical Characteristics of Ultra–Fine Trench Isolation Fabricated by a New Two–Step Filling Process", XP–000735146, Jap. J. Appl. Phys. vol. 35, 1996, pp. 1625–1627.

S. Nag et al., "Comparative Evaluation of Gap–Fill Dielelectrics in Shallow Trench Isolation for Sub–0.25μm Technologies", XP–000753846, IEEE, 1996, pp. 841–843.

* cited by examiner

*Primary Examiner*—Carl Whitehead, Jr.
*Assistant Examiner*—Thanhha Pham
(74) *Attorney, Agent, or Firm*—Young & Thompson

(57) ABSTRACT

A method for forming a semiconductor device having an isolation trench for separation of element regions includes the steps of forming a pad oxide film and a silicon nitride film on a silicon substrate, forming an isolation trench by using the silicon nitride film as a mask, forming consecutively a thermal oxide film, CVD oxide film and a bias oxide film in the isolation trench, removing the films above a specified level of the silicon substrate to leave the isolation trench filled with oxide films. The bias oxide film is formed by a high-density plasma CVD technique. The silicon surface is protected by the CVD oxide film against the plasma damage during the high-density CVD step, thereby obtaining excellent characteristics of transistors.

10 Claims, 5 Drawing Sheets

US 6,599,811 B1

1

SEMICONDUCTOR DEVICE HAVING A SHALLOW ISOLATION TRENCH

BACKGROUND OF THE INVENTION (a) Field of the Invention

The present invention relates to a semiconductor device having a shallow isolation trench and, more particularly, to a technique for forming a shallow isolation trench for separation between device elements in a LSI.

(b) Description of the Related Art

In a shallow trench isolation (STI) technique, element regions for forming device elements such as transistors are isolated from one another by using a shallow trench. In a dynamic random access memory (DRAM) using the STI technique, for example, the dimensions of the shallow trench has been increasingly reduced with the reduction of the device elements and improvement of the fabrication technique for the LSI.

FIGS. 1 and 2 show an example of a semiconductor device in fabrication steps thereof at a location of a shallow isolation trench. In FIG. 1, a silicon oxide film (or pad oxide film) 32 having a thickness of about 200 angstroms and a mask silicon nitride (SiN) film 33 having a thickness of 0.15 micrometers ($\mu$m) are consecutively formed on a silicon substrate 31, followed by formation of a photoresist film (not shown) having a mask pattern. Subsequently, the mask nitride film 33 and the pad oxide film 32 are selectively etched by using the photoresist film as a mask to expose a portion of the silicon substrate 31, followed by dry etching of the silicon substrate 31 for a specified depth to form a shallow isolation trench 34 for isolation of device elements.

Thereafter, a silicon oxide film 35 having a specified thickness is formed by a low-pressure chemical vapor deposition (LPCVD) within the isolation trench 34 and in the vicinity thereof, followed by chemical-mechanical polishing (CMP) of portions of the CVD oxide film 35 and the mask nitride film 33 disposed above a dotted line "A". Subsequently, the CVD oxide film 35, the mask nitride film 33 and the thermal oxide film 32 are subjected to a wet etching for removing the portions of the CVD oxide film 35, the mask nitride film 33 and the thermal oxide film 32 disposed above a dotted line "B" to expose the surface of the silicon substrate 11 and to leave portions of the CVD oxide film 35 and the thermal oxide film 32 within the shallow isolation trench 34.

Thereafter, as shown in FIG. 2, a gate oxide film 37 is formed on the exposed surface of the silicon substrate 31, followed by another CVD step to form a polycrystalline silicon (polysilicon) film 38 on the CVD oxide film 35 and the gate oxide film 37. An amorphous silicon film may be formed instead of the polysilicon film 38.

The current fabrication technique for the semiconductor devices enables to form a shallow isolation trench having a width of about 0.5 $\mu$m. However, if the width of the isolation trench to be formed in a LSI is less than 0.4 $\mu$m, such as in the case of 0.25 $\mu$m design rule, the LSI thus fabricated has a defect as detailed below.

As exemplarily depicted in FIG. 1, a self-shadowing phenomenon often results in the step of deposition of the CVD oxide film 35 due to an undesired anisotropic deposition, wherein the CVD oxide film 35 contains a void therein at the central portion of the shallow isolation trench 34 as viewed in the horizontal direction. If the void 36, as shown in FIG. 2, remains after the wet etching, the CVD

2 polysilicon film 38 is received in the void 36 to form an undesired silicon region 39. The silicon region 39 may cause a short-circuit failure between gate electrodes, for example, in an interconnect pattern formed on the silicon region 39. In short, the STI technique may involve a short-circuit failure due to the void of the CVD oxide film 35 in the case of a finer pattern for the device elements.

A high density plasma CVD (HDP-CVD) technique is now expected to solve the above problem in the current STI technique by effecting simultaneous deposition and etching of the oxide film 35. The HDP-CVD technique generally uses a low-pressure plasma, wherein electron density is designed between about $10^{12}$ and about $10^{14}$ to increase the mean free path of electrons, while a bias voltage is applied to the substrate to further increase the vertical component of the mean free path of the electrons.

In this technique, a larger thickness of the deposited oxide film minus smaller thickness of the etched oxide film provides a moderate deposition of a resulting oxide film (hereinafter referred to as a bias oxide film) having a higher density than an ordinary CVD film, which is suitable for a shallow isolation trench having a smaller width. Inductive coupled plasma or electron cyclotron plasma may be used as the plasma source for the HDP-CVD process.

Although the proposed HDP-CVD technique provides a bias oxide film having a higher density which can be effectively deposited in an isolation trench having a high aspect ratio, a MOS device having the isolation trench thus formed sometime involves a defect wherein a current-voltage characteristic of MOS transistors varies.

SUMMARY OF THE INVENTION

In view of the above, it is an object of the present invention to provide a method for manufacturing a semiconductor device including an isolation trench having a smaller width, by using an improved HDP-CVD process.

It is another object of the present invention to provide a semiconductor device having an improved isolation trench capable of suppressing variations in the current-voltage characteristics of transistors.

The present invention provides a method for manufacturing a semiconductor device comprising the consecutive steps of etching a surface region of a silicon substrate to form an isolation trench, forming a thermal oxide film on an inner wall of the isolation trench, depositing a CVD oxide film on the thermal oxide film, depositing a bias oxide film overlying the silicon substrate including inside of the isolation trench by a high-density plasma CVD technique, removing a portion of the bias oxide film remaining above a specified level of the silicon substrate to leave the isolation trench filled with the bias oxide film, and forming a plurality of element regions separated by the isolation trench from one another.

The present invention also provides a semiconductor device comprising a silicon substrate having an isolation trench thereon, and a plurality of element regions isolated from one another by the isolation trench, the isolation trench including therein a thermal oxide film, CVD oxide film and a bias oxide film consecutively deposited from a bottom surface of the isolation trench, the bias oxide film having a higher density than the CVD oxide film.

In accordance with the semiconductor device of the present invention and the semiconductor device manufactured by the method of the present invention, the current-voltage characteristic of the transistor can be improved because the oxide film deposited by the CVD step before the HDP-CVD step protects the thermal oxide film which in turn protects the silicon surface during the HDP-CVD step, whereby the silicon surface is not exposed to and protected against the HDP.

The above and other objects, features and advantages of the present invention will be more apparent from the following description, referring to the accompanying drawings.

PREFERRED EMBODIMENT OF THE INVENTION

Before describing an embodiment of the present invention, a defect caused in the conventional HDP-CVD technique will be described for a better understanding of the present invention.

Figure 1:
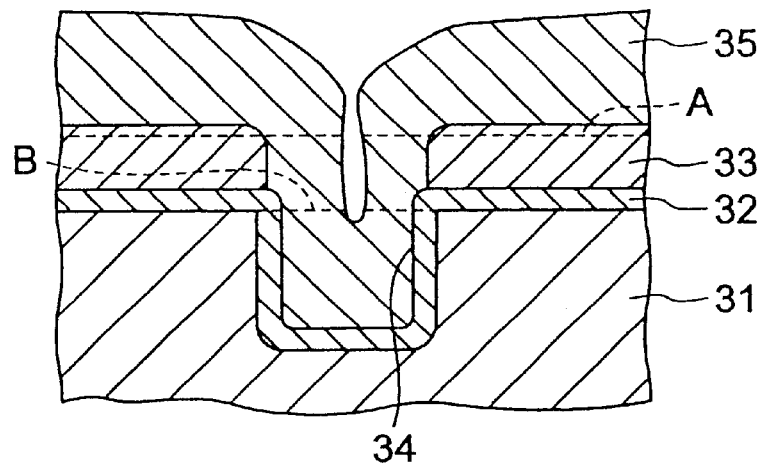
FIG. 1 is a sectional view of a conventional semiconductor device having an isolation trench at a fabrication step thereof.
Figure 2:
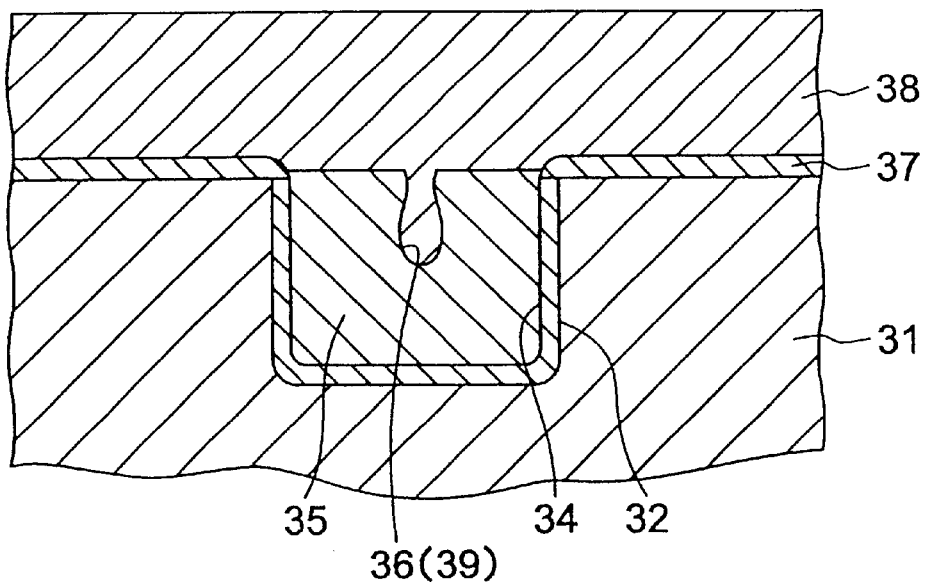
FIG. 2 is a sectional view of the semiconductor device of FIG. 1 at a following step.
Figure 3:
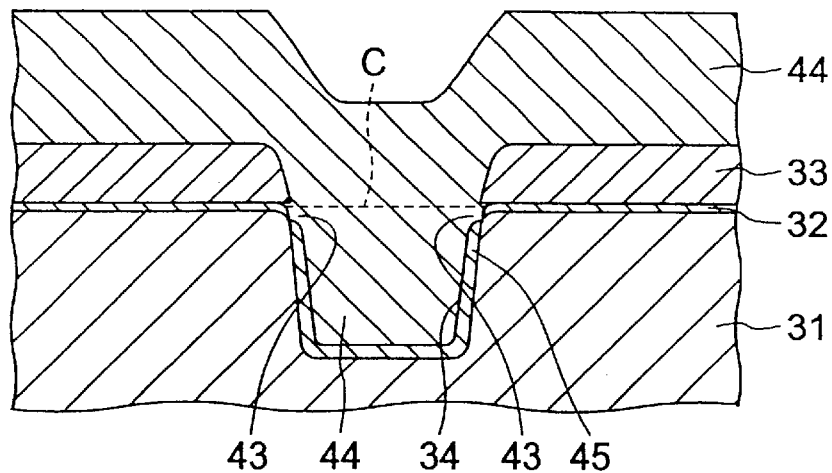
FIG. 3 is a sectional view of another conventional semiconductor device manufactured by a HDP-CVD process.

Referring to FIG. 3, the HDP-CVD process includes the step of forming a pad silicon oxide film 32 and a mask silicon nitride film 33 consecutively on a silicon substrate 31, followed by formation of a photoresist pattern (not shown) on the mask nitride film 33. After selectively etching the pad oxide film 32 and the mask nitride film 33 by a dry etching using the photoresist pattern as a mask, an isolation trench 34 is formed on the silicon substrate 31 by a dry etching using the mask nitride film 33 as a mask. Subsequently, a thermal oxidation is performed to form a silicon oxide film 45 within the isolation trench 34, the thermal oxide film 45 extending from the edge of the pad oxide film 32 on top of the silicon substrate 31 to cover the side walls and the bottom wall of the isolation trench 34.

Thereafter, a bias CVD oxide (SiO2) film 44 is deposited by a HDP-CVD process over the entire surface including the inside of the isolation trench 34. In this HDP-CVD process, the bias oxide film 44 is deposited while the thermal oxide film 45 is etched. Especially, the thermal oxide film 45 is strongly attacked at the top corner region 43 of the isolation trench 34 during the HDP-CVD process, whereby a surface region of the silicon substrate 31 is exposed from the thermal oxide film 45 within the isolation trench 34 a the top corner region 43.

Figure 4:
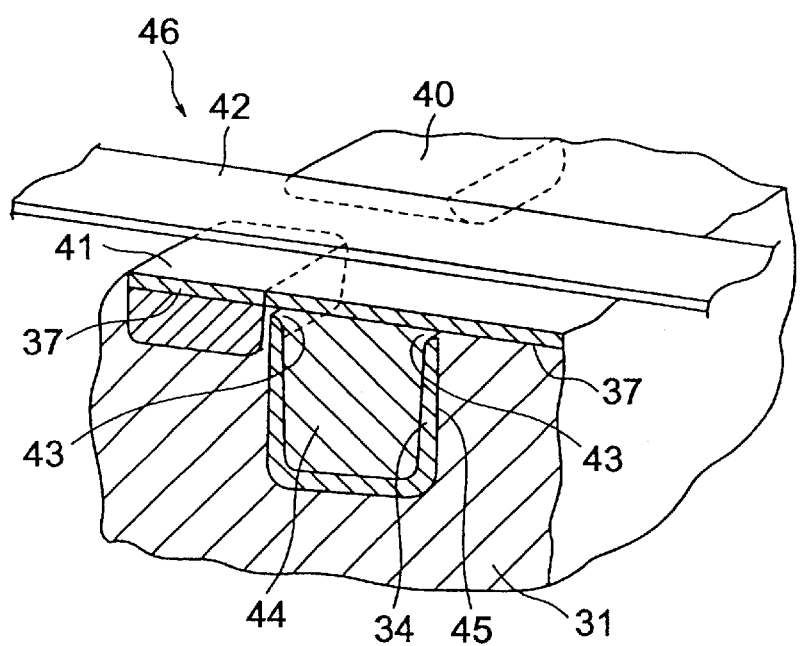
FIG. 4 is a perspective view of the semiconductor device of FIG. 3 at a following step thereof.

Referring to FIG. 4 showing the semiconductor device formed by using the HDP-CVD process, the semiconductor device includes a MOS transistor 46 having a gate 42 and source and drain electrodes 40 and 41 disposed in a spaced relationship with each other along the isolation trench 34. The isolation trench 34 has in the vicinity of the transistor 46 a location where the mask nitride film 33, the pad oxide film 32 and the bias oxide film 44 are etched back.

In the resulting MOS transistor 46, it is found that the transistor characteristic is damaged because of the variations in the gate voltage dependence of the drain current due to the exposed surface of the silicon substrate 31 at the top corner region 43 of the isolation trench 34. The present invention is devised for preventing the silicon surface from being exposed in the isolation trench, as detailed below.

Figure 5A:
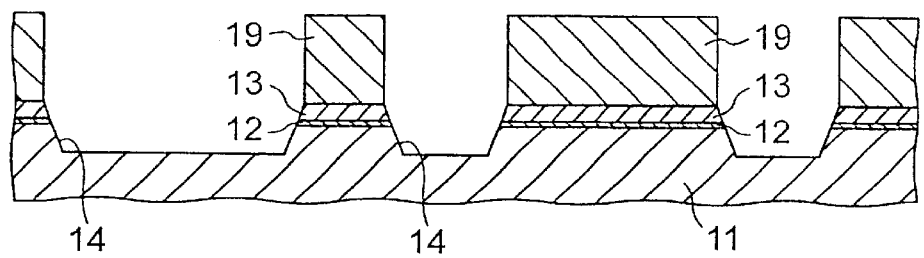
FIGS. 5A to 5D are sectional views of a semiconductor device at consecutive steps of a fabrication process thereof according to an embodiment of the present invention.
Figure 6A:
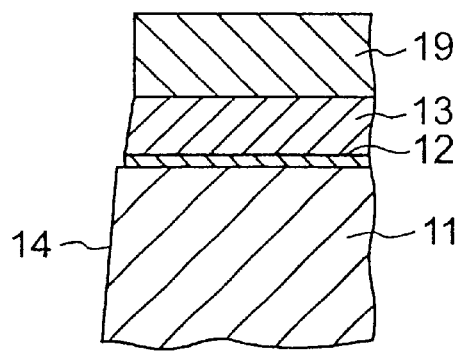
FIGS. 6A to 6D are enlarged partial sectional views of the semiconductor device of FIGS. 5A to 5D at specified steps.

Now the embodiment of the present invention is more specifically described with reference to the accompanying drawings. Referring to FIG. 5A showing a step of fabrication process of the present embodiment, a 200-angstrom-thick pad oxide film 12 and a 0.15-micrometer-thick mask nitride film 13 are consecutively formed on a silicon substrate 11, followed by the step of formation of a photoresist pattern 19 on the mask nitride film 13. Subsequently the mask nitride film 13 and the pad oxide film 12 are subjected to a selective etching using the photoresist pattern 19 as a mask to expose a surface region of the silicon substrate 11. Further, the exposed region of the silicon substrate 11 is subjected to a dry etching to form an isolation trench 14 having a depth of 0.4 μm and a width of 0.4 μm or less. The detail of the films at this step is depicted in FIG. 6A, wherein the pad oxide film 12, the mask nitride film 13 and the photoresist pattern 19 define an edge substantially flush with the side wall of the isolation trench 14.

Figure 6B:
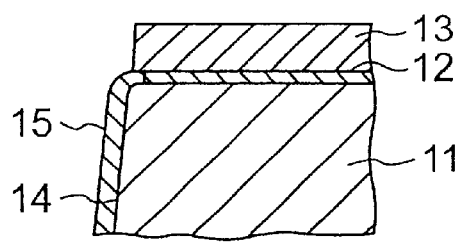

Thereafter, as shown in FIG. 6B, a 1000-angstrom-thick thermal oxide film 15 having an excellent coverage characteristic is formed on the surface of the isolation trench 14 at a temperature of 1100° C., for example. The thermal oxide film 15 extends from the cut edge of the pad oxide film 12 and covers the side walls and the bottom wall of the isolation trench 14. The thickness of the thermal oxide film 15 is preferably between 200 and 600 angstroms so as to effectively protect the silicon surface and not to form a bird's beak.

Figure 5B:
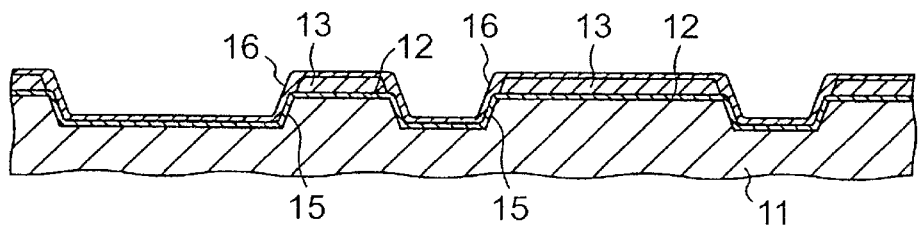
Figure 5C:
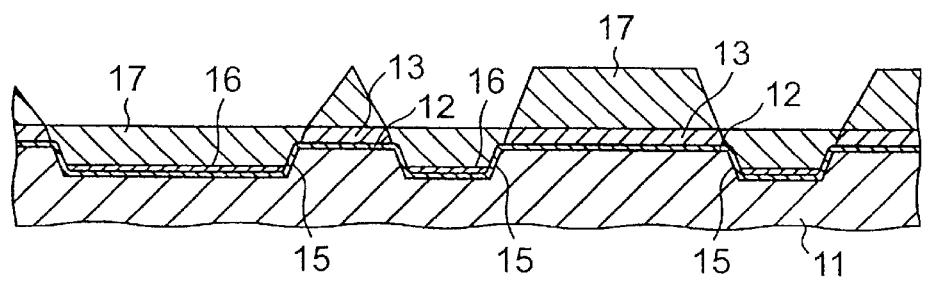
Figure 6C:
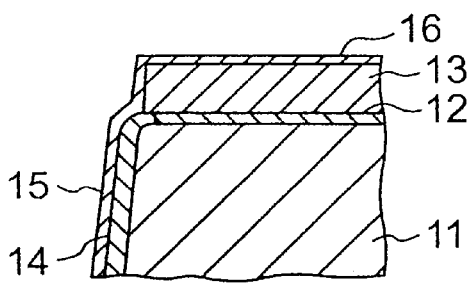

Subsequently, a thin CVD oxide film 16 is deposited on the entire surface of the wafer including the surfaces of the thermal oxide film 15 and the mask nitride film 13 by a LPCVD technique together with a high temperature oxidation technique, as shown in FIG. 5B. FIG. 6C depicts the detail of the thin CVD oxide film 16, wherein the CVD oxide film 16 covers the entire surface of the wafer, covering directly the thermal oxide film 15 and the mask nitride film 13.

Figure 5D:
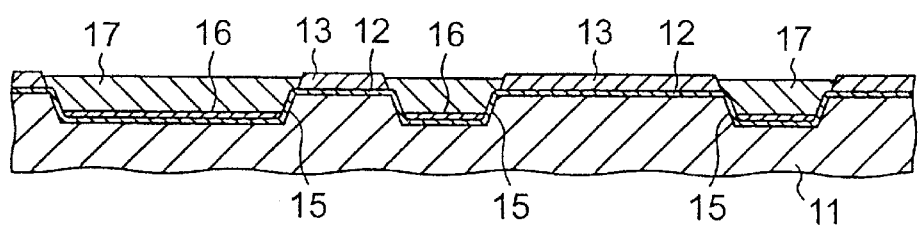

Further, a bias oxide film 17 is deposited in the isolation trench 14 and on other portions of the wafer by a HDP-CVD technique using a bias deposition system at a temperature between about 200 and about 400° C., and at a pressure between about 1 and about 10 mmTorr. In this step, the bias oxide film 17 is moderately deposited while the CVD oxide film 16 is substantially entirely removed by a low-pressure plasma etching, with an inclination angle being about 45° at the edge of the bias oxide film 17. The bias oxide film 17 is formed in the isolation trench 14 and on the mask nitride film 13 in the vicinity of the isolation trench 14. The inclination angle depends on the bias power, and is about 40° for 1500 watts of the bias power, about 45° for 3500 watts, and about 50° for 5000 watts. Thereafter, the bias oxide film 17 is subjected to a CMP (chemical-mechanical polishing) step to obtain a substantially planar surface for the bias oxide film 17, as shown in FIG. 5D, wherein element regions 20 for receiving therein MOS transistors are separated by the isolation trench 34.

Figure 6D:
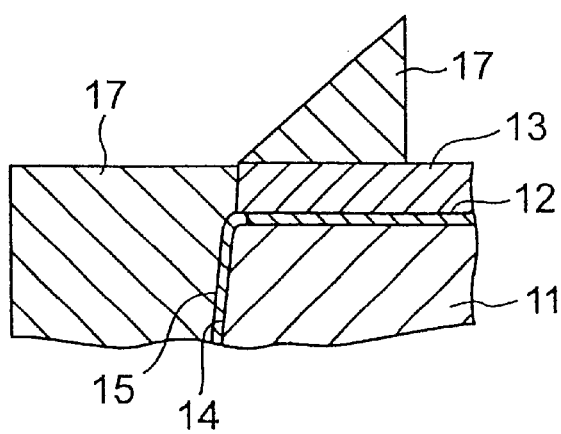
Figure 7A:
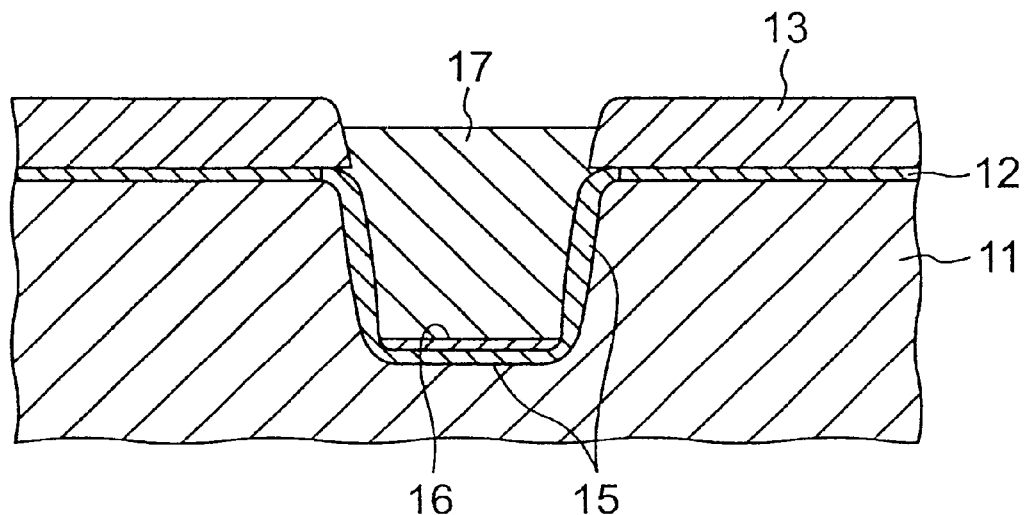
FIGS. 7A and 7B are enlarged detailed sectional views of the semiconductor device of FIGS. 5A to 5D at specified steps.

FIG. 7A shows the detail of the semiconductor device at the step of FIG. 6D, wherein it is depicted that the CVD oxide film 16 is substantially entirely removed except for the bottom of the isolation trench 14, whereas the thermal oxide film 15 remains substantially as it is due to the protection by the CVD oxide film 16. The remaining thermal oxide film 15 effectively protects the silicon surface against the plasma damage during the HDP-CVD process.

The thickness of the CVD oxide film 16 as deposited is preferably between about 100 and about 600 angstroms, and more preferably between about 200 and about 400 angstroms. The CVD oxide film 16 having a thickness above 600 angstroms may cause a higher aspect ratio of the isolation trench to degrade the coverage of the bias oxide film 17, although the larger thickness provides a stronger protection of the thermal oxide film 15 and affords excellent characteristics for MOS transistors or gate oxide film thereof.

Figure 7B:
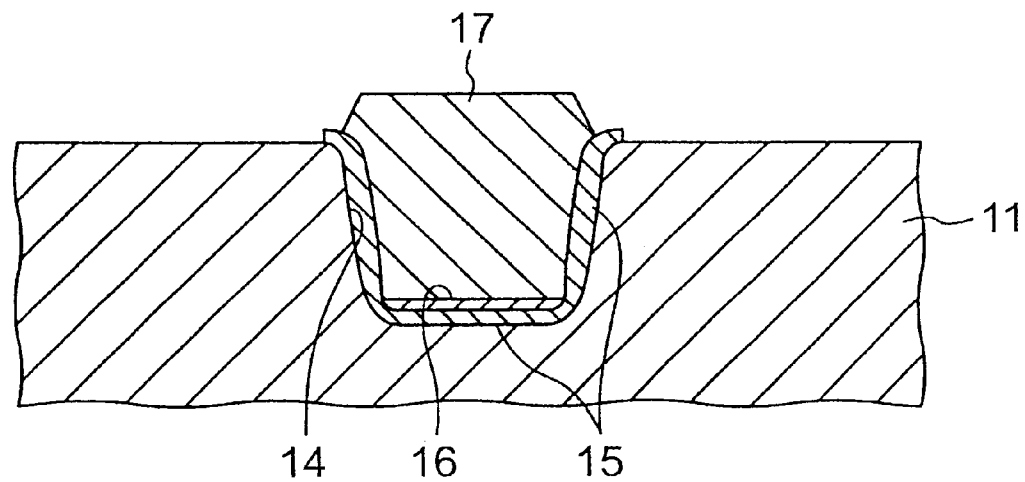

After the step of FIG. 7A, the mask nitride film 13 is etched by wet etching using heated phosphoric acid, and then the pad oxide film 12 is etched by wet etching using hydrogen fluoride, thereby obtaining the structure shown in FIG. 7B. In this structure, the isolation trench 14 of the semiconductor device includes therein the thermal oxide film 15, the CVD oxide film 16 and the bias oxide film 17 which are consecutively formed on the bottom surface of the isolation trench 14. The CVD oxide film 16 is generally removed by the HD-CVD process from the other portion of the isolation trench 14 such as the side walls thereof.

As described above, in the embodiment of the present invention, the HDP-CVD process provides a bias oxide film 17 having a higher density in the isolation trench 14 whereas the CVD oxide film 16 protects the thermal oxide film 15 to protect the silicon surface against the plasma damage by the HDP-CVD. By this technique, the HDP-CVD process does not degrade the transistor characteristic even in the case of an isolation trench having an aspect ratio as high as 1.5 or more. The process of the present embodiment can be applied to a semiconductor device of 0.25 μm or 0.18 μm design rule.

The CVD oxide film 16 provides another advantage of protection of the mask nitride film 13 against electrostatic absorption during transportation of the wafer effected at an intermediate step of the fabrication process. Generally, the wafers are transported by a carriage with the top surface of the wafer on the carriage, which causes an electrostatic absorption due to the electrostatic charge accumulated on the silicon nitride film during the transportation of the wafer, if the silicon nitride film is not covered by the CVD oxide film.

The method of the present invention can be applied to bipolar transistor device, flash memory, DRAM in addition to the MOS device.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising the consecutive steps of:

heating a silicon substrate to form a pad thermal oxide film directly contacting said silicon substrate, etching a surface region of said silicon substrate to form an isolation trench and retain said pad thermal oxide film in regions apart from said isolation trench, forming a thermal oxide film on an inner wall of said isolation trench and contacting an edge of said pad thermal oxide film at a location apart from the inner wall, depositing a CVD oxide film by a high temperature oxidation technique directly contacting on said thermal oxide film, depositing a bias oxide film overlying said silicon substrate including inside of said isolation trench by a high-density plasma CVD technique, removing a portion of said bias oxide film remaining above a specified level of said silicon substrate to leave said isolation trench filled with said bias oxide film, and forming a plurality of element regions separated by said isolation trench from one another.

2. The method as defined in claim 1, wherein said thermal oxide film has a thickness between about 200 and about 600 angstroms.

3. The method as defined in claim 1, wherein said CVD oxide film has a thickness between about 100 and about 600 angstroms.

4. The method as defined in claim 1, wherein said CVD oxide film extends from a cut edge of said pad thermal oxide film at a top corner region of said isolation trench remote from the inner wall.

5. The method as defined in claim 1, wherein said films removing step includes a chemical-mechanical polishing and a wet etching.

6. A method of manufacturing a semiconductor device comprising the consecutive steps of:

heating a silicon substrate to form a pad thermal oxide film directly contacting said silicon substrate, etching a surface region of said substrate to form an isolation trench and retain said pad thermal oxide film in regions apart from said isolation trench;

forming a thermal oxide film on a bottom surface and an inner wall of the isolation trench;

depositing a CVD oxide film by a high temperature oxidation technique directly contacting the thermal oxide film on the bottom surface and inner wall of the isolation trench;

completely filling the isolation trench with a bias oxide film using a high-density plasma CVD technique; and removing the bias oxide film from above a specified level of the substrate to leave the isolation trench filled with the bias oxide film, wherein the pad thermal oxide film and thermal oxide film meet at a location apart from the inner wall.

7. The method of claim 6, wherein said step of completely filling the isolation trench further comprises removing the CVD oxide film contacting the thermal oxide film on the inner wall of the isolation trench by a low-pressure plasma etching.

8. The method of claim 7, wherein the plasma etching is performed at an inclination angle between 40–50°.

9. The method of claim 6, wherein said step of completely filling the isolation trench further comprises removing the CVD oxide film using a low-pressure plasma etching while leaving the CVD oxide film contacting the thermal oxide film of the bottom surface of the isolation trench.

10. The method of claim 9, wherein the plasma etching is performed at an inclination angle between 40–50°.

* * * * *